(12) United States Patent
Leem

(10) Patent No.: US 8,837,537 B2
(45) Date of Patent: Sep. 16, 2014

(54) LASER DIODE FOR CONTROLLING SPATIAL HOLE BURNING AND OPTICAL PULSE GENERATING METHOD

(75) Inventor: Young Ahn Leem, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 78 days.

(21) Appl. No.: 13/614,748

(22) Filed: Sep. 13, 2012

(65) Prior Publication Data

US 2013/0148675 A1 Jun. 13, 2013

(30) Foreign Application Priority Data

Dec. 13, 2011 (KR) .......................... 10-2011-0133827

(51) Int. Cl.
*H01S 3/10* (2006.01)
*H01S 3/08* (2006.01)

(52) U.S. Cl.
USPC .............................................. 372/28; 372/96

(58) Field of Classification Search
CPC ....... H01S 5/026; H01S 5/0268; H01S 5/028; H01S 5/0601; H01S 5/0625; H01S 5/026255; H01S 5/06256; H01S 5/06258
USPC .............................. 372/28, 50.11, 96, 99, 102
See application file for complete search history.

(56) References Cited

U.S. PATENT DOCUMENTS 6,678,289 B2 * 1/2004 Kim ................................ 372/20
7,720,128 B2 5/2010 Leem et al.

* cited by examiner

*Primary Examiner* — Armando Rodriguez
(74) *Attorney, Agent, or Firm* — Rabin & Berdo P.C.

(57) ABSTRACT

A high-efficiency laser diode is provided. Since a λ/4 phase-shifted distributed feedback (DFB) laser diode has a great coupling coefficient, mode stability is poor due to spatial hole burning when multiplication of the coupling coefficient by length of a resonator is equal to or greater than 2. In the inventive concept, a region capable of controlling spatial hole burning is inserted into a semiconductor laser diode structure. Thus, an ultrahigh-speed pulse laser diode having a repetition rate in the band ranging from 100 GHz to 300 GHz is obtained. In addition, a single-mode laser diode with improved energy use efficiency is implemented by changing the configuration of a laser diode.

16 Claims, 6 Drawing Sheets

LASER DIODE FOR CONTROLLING SPATIAL HOLE BURNING AND OPTICAL PULSE GENERATING METHOD

CROSS-REFERENCE TO RELATED APPLICATIONS

This US non-provisional patent application claims priority under 35 USC §119 to Korean Patent Application No. 10-2011-0133827, filed on Dec. 13, 2011, the entirety of which is hereby incorporated by reference.

BACKGROUND OF THE INVENTION

The present general inventive concept relates to the obtainment of an optical pulse using a laser diode and, more particularly, a laser diode for controlling spatial hole burning and an optical pulse generating method.

An optical pulse is used for various purposes such as clock reproduction by a reproducer in optical communication, a light source in optical communication, a light source for optical sampling, a carrier for radio-frequency (RF) communication, and so forth.

In particular, when an optical pulse is generated using a semiconductor laser diode, a device using the same has advantages in size and economical efficiency. For this reason, various researches have been conducted on a pulse laser diode.

A physical mechanism causing a laser diode to emit a pulse may be Q-switching (or gain switching), mode beating or mode locking.

The Q-switching (or gain switching) is not suitable for generating an ultrahigh-speed pulse because there is a limitation in speed for an optical output.

In case of the mode locking, a pulse is generated by increasing a reaction between oscillation modes which is achieved by inserting a nonlinear region such as a saturable absorber into a resonator. A repetition rate is determined by a distance between the modes and expressed as follows: $\Delta v=c/(2\,nL)$, wherein $\Delta v$ represents a frequency difference between modes, c represents speed of light, n represents a group refractive index of a waveguide, and L represents a length of a resonator. Since a length of a resonator is 200 micrometers or less when a frequency of a pulse is above 300 GHz, there is a limitation in gain length. The limitation in gain length makes it difficult to construct a laser diode.

The case of the mode beating is a structure including two independent laser diode regions. An RF pulse is generated by independently selecting wavelengths of two oscillatory waves. In this case, since a distance between two modes can be adjusted arbitrarily, there is an advantage in generating an RF pulse. Unfortunately, there are many disadvantages in generating a pulse in a region of 100 GHz to 300 GHz due to the stop-band overlap of a distributed feedback (DFB) laser diode used for a single mode.

Accordingly, there is a requirement for a pulse laser having the wide frequency-adjustable range in a region of 100 GHz to 300 GHz. In addition, there may be a need for obtaining a single-mode laser diode that is efficient in use of energy by increasing an optical output in one direction.

SUMMARY OF THE INVENTION

Embodiments of the inventive concept provide a laser diode for controlling spatial hole burning and an optical pulse generating method.

According to an aspect of the inventive concept, the laser diode may include a grating layer; a reflection region formed at an upper portion of the grating layer; a diode region spaced apart from the reflection region and formed at an upper portion of the grating layer; and an optical density control region formed between the reflection region and the diode region to control the spatial hole burning such that wideband frequency characteristics are obtained.

In an example embodiment, the grating layer may be formed of an index-coupled grating.

In an example embodiment, the diode region may be a region in which a $\lambda/4$ phase-shifted distributed feedback (DFB) laser diode is formed.

In an example embodiment, a Bragg wavelength in the reflection region may be shorter than that in the diode region.

In an example embodiment, a forward voltage may be applied to the optical density control region.

In an example embodiment, in the optical density region, an oscillation frequency may be controlled by adjusting a distance between a −1 mode and a mode generated by $\lambda/4$ phase shift.

In an example embodiment, the optical density control region may be formed at an InGaAsP active layer grown on the grating layer.

In an example embodiment, the oscillation frequency may have a band raging from 100 GHz to 300 GHz.

According to another aspect of the inventive concept, the optical pulse generating method may include forming a reflection region and an optical density control region at one end of a diode region formed at an upper portion of a grating layer; and controlling an optical density of the optical density control region to alleviate spatial hole burning in the entire resonator.

In an example embodiment, when the optical density of the optical density control region is controlled, a Bragg wavelength in the reflection region may be made shorter than that in the diode region to increase a reflectivity with respect to a −1 mode of the diode region.

In an example embodiment, a distance between the −1 mode of the diode region and a mode generated by $\lambda/4$ phase shift may be adjusted by controlling the optical density of the optical density control region to obtain a desired oscillation frequency.

In an example embodiment, the grating layer may be formed of an index-coupled grating.

In an example embodiment, the diode region may be a region in which a $\lambda/4$ phase-shifted distributed feedback (DFB) laser diode is formed.

In an example embodiment, a forward voltage above a built-in voltage may be applied to the optical density control region.

In an example embodiment, the optical density control region may be formed at an InGaAsP active layer grown on the grating layer.

In an example embodiment, the oscillation frequency may have a band raging from 100 GHz to 300 GHz.

According to another aspect of the inventive concept, the laser diode may include a grating layer; a diode region formed at an upper portion of the grating layer; and an optical density control region having one side where a high-reflectivity coating film for wavelength reflection and formed adjacent to the diode region at an upper portion of the grating layer to suppress the spatial hole burning such that single-mode oscillation is obtained.

In an example embodiment, the grating layer may be formed of an index-coupled grating.

In an example embodiment, the diode region may be a region in which a λ/4 phase-shifted distributed feedback (DFB) laser diode is formed.

In an example embodiment, the optical density control region may be formed at an InGaAsP active layer grown on the grating layer.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION

Figure 1:
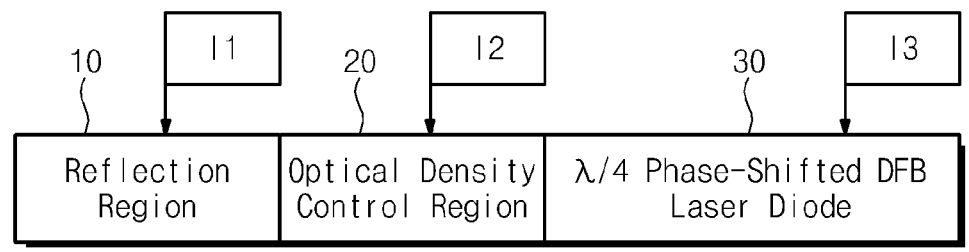
FIG. 1 is a schematic configuration diagram of a laser diode according to the inventive concept.

The objects, advantages, and features of the inventive concept will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose examples of the inventive concept and to let those skilled in the art understand the nature of the inventive concept.

In the specification, it will also be understood that when an element or parts are referred to as being "on" a target element block, it can be directly on the target element block, or intervening another element may also be present.

Throughout the drawings, the same or similar reference numerals designate the same or similar elements. In some drawings, relationships between elements and lines are explained for clarity of the inventive concept and blocks may be further provided on other elements or electronic components.

It is to be noted that embodiments described and exemplified herein should be interpreted to include complementary embodiments thereof. Also it is to be noted that basic explanations with respect to the configuration and manufacturing or operation principle of a typical laser diode in the field of optical communication will not be done in detail to prevent ambiguity of the inventive concept.

FIG. 1 is a schematic configuration diagram of a laser diode according to the inventive concept. As illustrated, the laser diode includes a reflection region 10, an optical density control region 20, and a diode region 30.

Figure 4:
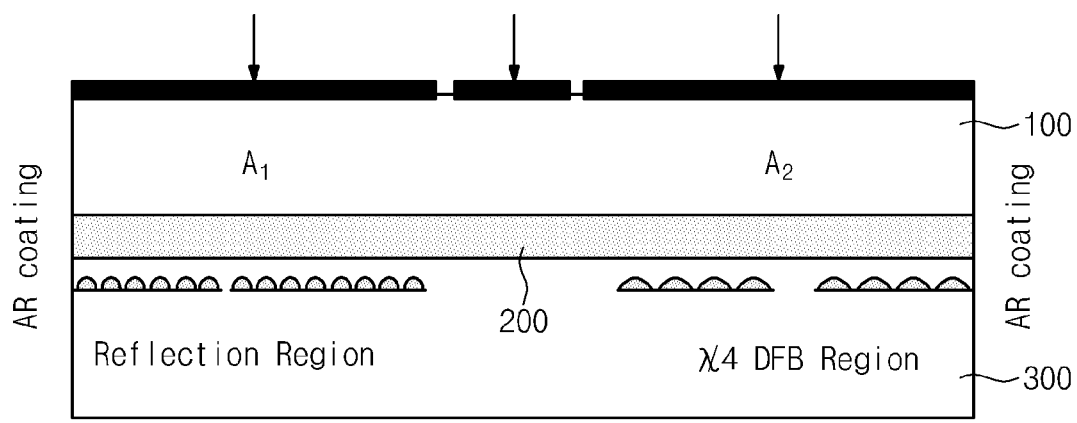
FIG. 4 is a schematic cross-sectional configuration diagram of a laser diode according to the embodiment in FIG. 1.

These regions 10, 20, and 30 are formed at upper portions of a grating layer 300, as shown in FIG. 4.

The reflection region 10 is formed at an upper portion of the grating layer 300. The grating layer 300 may be formed of an index-coupled grating.

The diode region 30 is formed at an upper portion of the grating layer 300 to be spaced apart from the reflection region 10. In the diode region 30, a λ/4 phase-shifted distributed feedback (DFB) laser diode may be formed.

The optical density control region 20 is formed between the reflection region 10 and the diode region 30. In the optical density control region 20, spatial hole burning is controlled to obtain broadband frequency characteristics.

In order to obtain a multi-mode optical pulse output, a Bragg wavelength in the reflection region 10 may be adjusted to be shorter than that in the diode region 30.

In the optical density control region 20, a distance between a −1 mode and a mode formed by λ/4 phase shift is adjusted to control a resonant frequency in the band ranging from 100 GHz to 300 GHz.

A diffraction grating formed at the grating layer 300 has a unique reflection spectrum. A central wavelength denotes a Bragg wavelength. A grating period (Λ), the Bragg wavelength (λ), and the refractive index of a medium (n) have a relationship, as follows: Λ=λ/2n.

When the index-coupled grating is used, oscillation occurs at a point A (−1 mode) or a point C (+1 mode). This is due to the oscillation condition that a phase must be an integer multiple of 360 degrees while a resonant wave takes one round trip through a laser resonator.

Since the diffraction grating provides a phase shift of 180 degrees with respect to the Bragg wavelength, oscillation does not occur at the Bragg wavelength but occurs at two (right and left) wavelengths that meet the oscillation condition. This causes a fundamental problem in manufacturing a single-wavelength light source to occur in manufacture of a DFB laser diode. A phase shift region is inserted to overcome the problem. In general, a well-known method is that a diffraction grating is shifted by half period to have a phase shift of 360 degrees during one round trip. In this case, the laser diode oscillates at the Bragg wavelength (B), which causes an optical density in a phase change region to increase and thus spatial hole burning may occur. As a result, the position of the resonant wave deviates from the center of the −1 and +1 modes and leans to a long wavelength.

In the inventive concept, a pulse laser with a wide frequency band is generated using the leaning characteristic. That is, the configuration shown in FIG. 1 is implemented, and an optical density in the optical density control region 20 is controlled to adjust a frequency of a pulse. In the λ/4 phase-shifted DFB laser diode, if a relative position to both modes of a DFB oscillation wavelength is adjusted, an output frequency of an optical pulse is adjusted. On the other hand, the reflection region 10 has greater reflectivity with respect to DFB short wavelength. In this case, a short-wavelength side mode and a λ/4 DFB oscillation wavelength oscillate at the same time.

Thus, the difficulty in generating a pulse within in the band ranging from 100 GHz to 300 GHz may be overcome and a relatively large variable width may be made.

Figure 2:
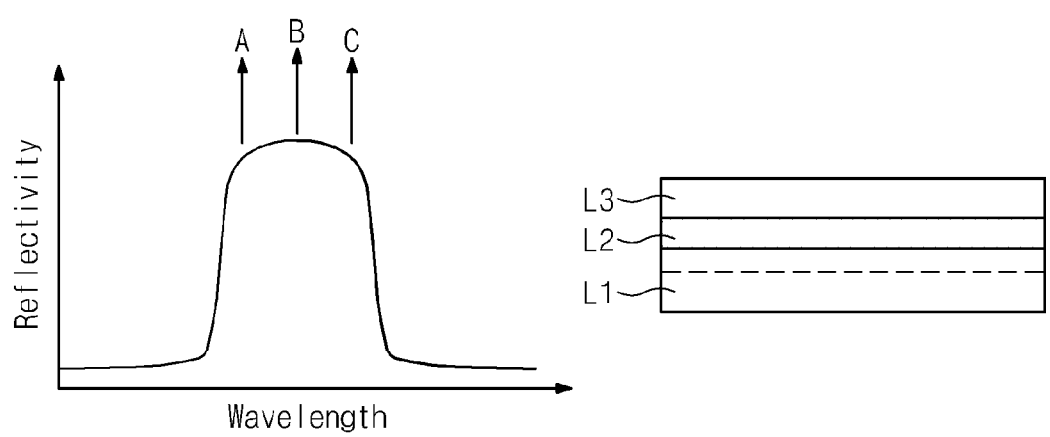
FIG. 2 exemplarily illustrates reflectivity to wavelength when a uniform diffraction grating is used.

FIG. 2 exemplarily illustrates reflectivity to wavelength when a uniform diffraction grating is used. In the graph in FIG. 2, a horizontal axis represents wavelength and a vertical axis represents reflectivity. Exemplarily, a region L1 is a substrate region in which the diffraction grating is formed. A region L2, acting as an active layer formed at an upper portion of the substrate, is a region for forming a laser diode. A region L3 is a region in which the laser diode is formed.

When a conventional uniform diffraction grating shown in FIG. 2 is used, an oscillation output is obtained between a −1 mode of short wavelength and a +1 mode of long wavelength.

However, when a λ/4 phase-shifted diffraction grating is used, an oscillation mode is formed at the center between the −1 and +1 modes.

When a coupling coefficient of a diffracting grating is great, an oscillation wavelength moves to a long wavelength between the −1 and +1 modes due to spatial hole burning. Moreover, threshold current of the −1 mode drops and, in severe cases, the −1 mode and an oscillation mode may oscillate at the same time. This phenomenon is entirely determined by an optical density distribution of the optical density control region 20.

As a result, in the inventive concept, an optical density at the end of a diffraction grating is controlled to adjust spatial hole burning in the whole resonator.

As shown in the configuration in FIG. 1, when the reflection region 10 and the optical density control region 20 are formed at one end of the diode region 30 and an optical density of the optical density control region 20 increases, spatial hole burning may be alleviated in the whole resonator. For multi-mode oscillation, a reflectivity to the −1 mode at the side of short wavelength is made greater than that of another oscillation wavelength and the +1 mode to simultaneously oscillate the −1 mode and a mode formed by λ/4 phase shift. The adjustment of an oscillation frequency is achieved through change of the optical density by applying a forward voltage to the optical density control region. In this case, a distance between the −1 mode and the mode formed by λ/4 phase shift is adjusted.

Figure 3:
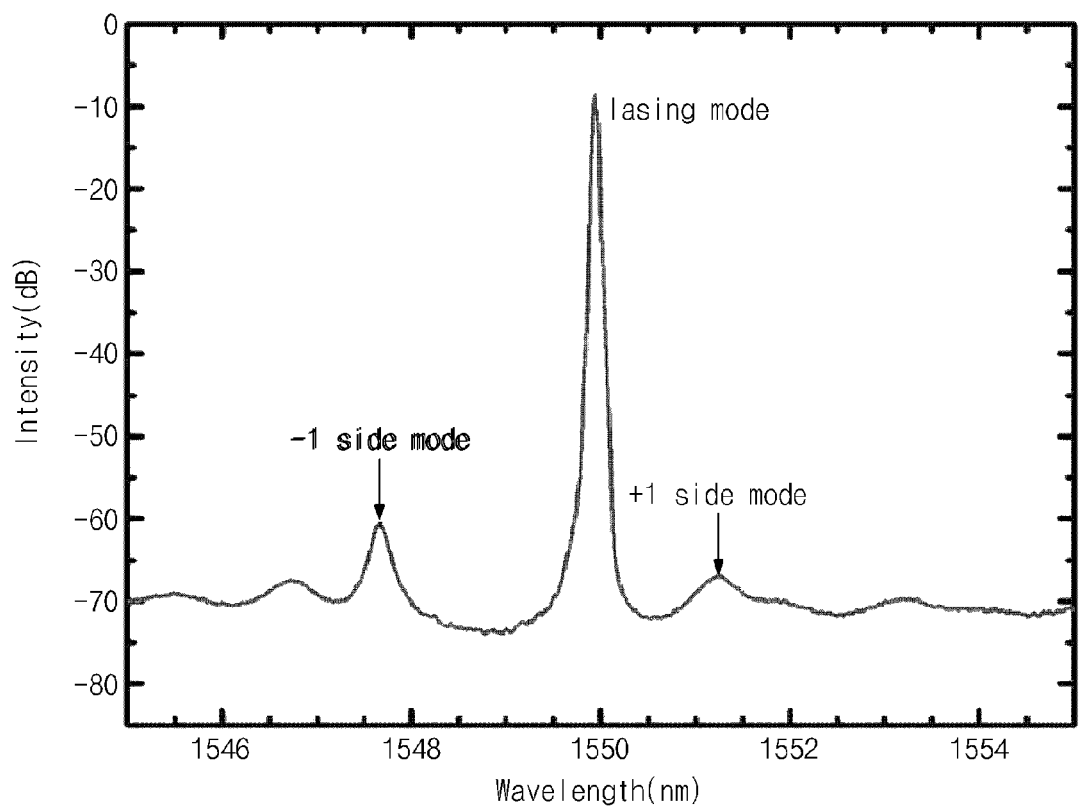
FIG. 3 illustrates oscillation wavelength characteristics of the laser diode according to FIG. 1.

FIG. 3 illustrates oscillation wavelength characteristics of the laser diode according to FIG. 1. In the graph in FIG. 3, a horizontal axis represents a nanometer unit and a vertical axis represents an optical density. As previously described, when a λ/4 phase-shifted diffraction grating is used, an oscillation mode is formed at the center between −1 and +1 modes. In this case, an oscillation wavelength is about 1550 nanometers in the embodiment.

FIG. 4 is a schematic cross-sectional configuration diagram of a laser diode according to the embodiment in FIG. 1. More specifically, FIG. 4 illustrates the cross-sectional configuration of a laser diode that is practically manufactured based on the conceptual configuration in FIG. 1.

The manufacture of a laser diode starts with growth of a grating layer 300 on an n-type InP substrate. When the growth of the grating layer 300 is completed, a diffraction grating is formed by means of a semiconductor manufacturing process. An InGaAsP active layer 200 is grown on the grating layer 300 where the diffraction grating is formed. A laser diode including three regions, as shown in FIG. 1, is manufactured at the active layer 200.

The laser diode is manufactured such that a Bragg wavelength in the reflection region 10 is shorter than a DFB Bragg wavelength. Thus, a reflectivity in the −1 mode of DFB laser is made relatively high.

In the case of FIG. 4, a reflection region includes a distributed Bragg reflector (DBR). However, a reflection region 10 (A1) may be removed and a coated film may be formed, instead of the reflection region 10 (A1), to have a high reflectivity on a facet of an optical density control region 20.

Additionally, a Bragg wavelength of the diffraction grating may be disposed at a long wavelength of a λ/4 phase-shifted DFB laser diode for operation to a single mode by changing a reflection structure. In this case, oscillation in the −1 mode is suppressed. That is, if spatial hole burning is suppressed, single-mode stability of the λ/4 phase-shifted DFB laser diode may be enhanced. If an optical power increases in an opposite direction due to the reflection region 10, the amount of the optical energy used increases as compared to input energy.

As described above, single-mode stability may be enhanced by changing a reflection structure and energy use efficiency may be improved by increasing an optical output.

Figure 5:
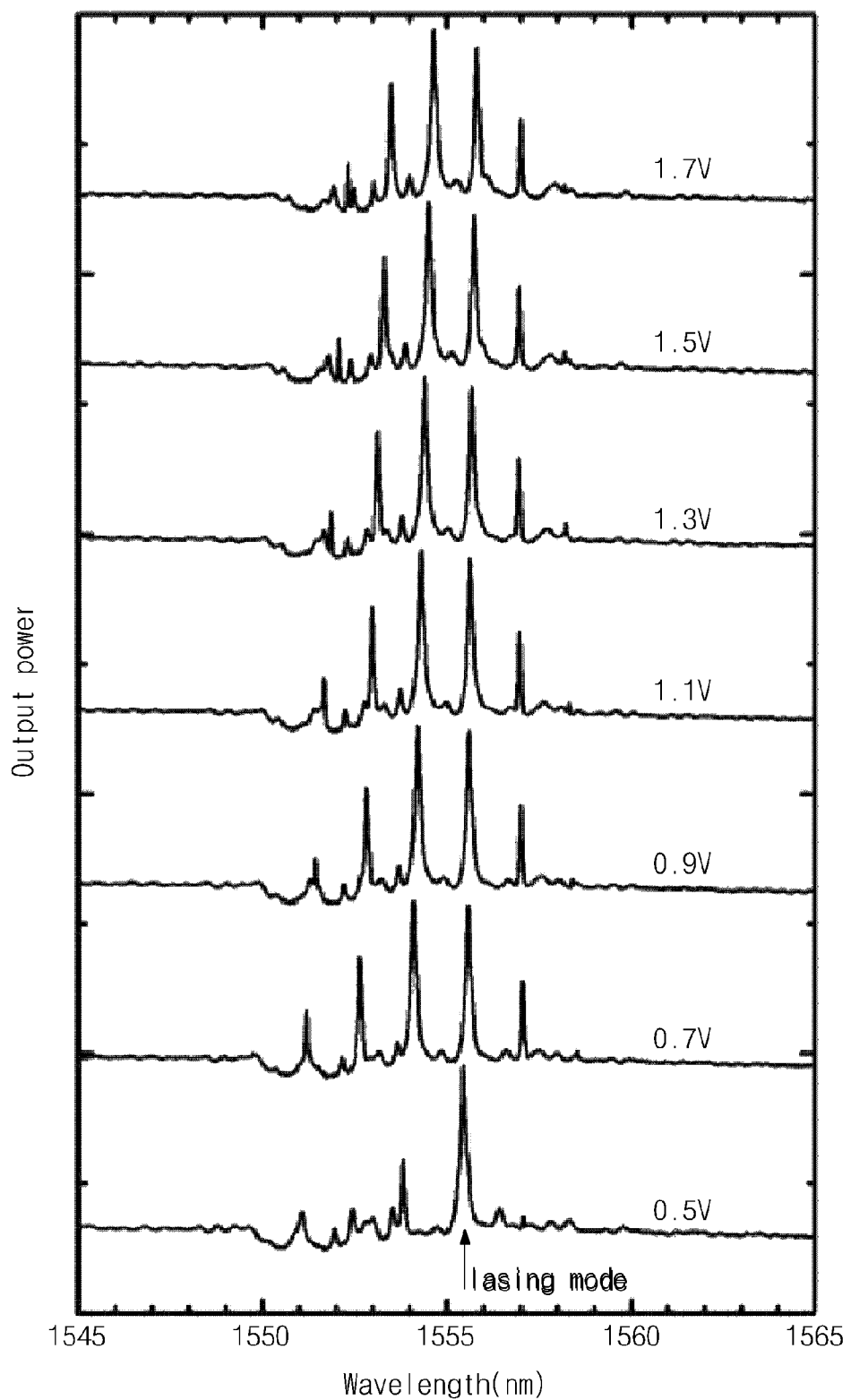
FIG. 5 illustrates output characteristics depending on voltages according to FIG. 4.

FIG. 5 illustrates output characteristics depending on voltages according to FIG. 4. In the graph in FIG. 5, a horizontal axis represents a wavelength and a vertical axis represents an output power.

In FIG. 5, there are shown a plurality of optical spectra depending on a forward voltage applied to an optical density control region. During measurement, a value of current applied to a reflection structure and a DFB laser diode was made fixed while only a forward voltage was made to fluctuate in the optical density control region.

In case of a built-in voltage or below, the DFB laser diode oscillates in a single mode. Meanwhile, in case of a built-in voltage or above, the DFB laser diode oscillates in a dual mode by reflection of a reflector. A distance between the two modes varies depending on a voltage applied to the optical density control region. The width of the variation is observed to be 148 GHz to 184 GHz, i.e., above 20 percent. Looking modes that are present at both sides except for −1 and oscillation modes, it will be understood that a pulse is generated as a signal based on four wavemixing of the two modes.

Figure 6:
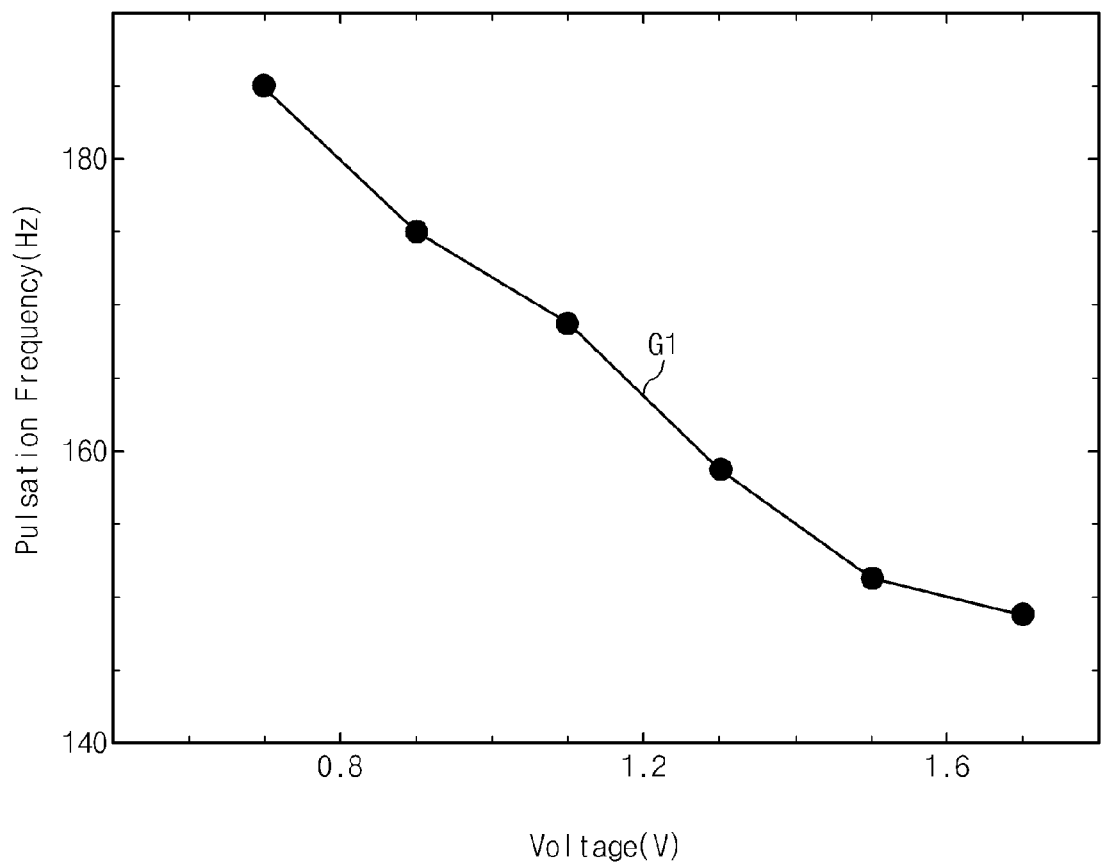
FIG. 6 illustrates voltage-to-frequency characteristics according to FIG. 4.

FIG. 6 illustrates voltage-to-frequency characteristics according to FIG. 4. In the graph in FIG. 6, a horizontal axis represents a voltage and a vertical axis represents a frequency of an optical pulse. From the graph G1 in FIG. 6, it will be understood that the higher a voltage, the less a frequency of an optical pulse.

According to the above-described embodiments of the inventive concept, since a laser diode is configured to use the same gain medium, manufacture of the laser diode is made easy. In addition, an output of an optical pulse can have the wide frequency-adjustable range due to a laser diode for controlling spatial hole burning. Furthermore, a high asymmetric power ratio of high light-generation efficiency is achieved during change to a single-mode laser diode.

While the inventive concept has been described with reference to illustrative embodiments, this description is not intended to be construed in a limiting sense. It will be clearly understood by those skilled in the art that foregoing description is merely by way of example and is not a limitation on the scope of the inventive concept. Various modifications and combinations of the illustrative embodiments, as well as other embodiments of the inventive concept, will be apparent to persons skilled in the art upon reference to the description. For example, in different cases, the shape, material or structure of an optical density control region or a reflection region may be modified or changed without departing from the spirit and scope of the inventive concept as defined by the following claims.

What is claimed is:

1. A laser diode for controlling spatial hole burning, comprising:
   a grating layer;
   a reflection region formed at an upper portion of the grating layer;
   a diode region spaced apart from the reflection region and formed at an upper portion of the grating layer; and
   an optical density control region formed between the reflection region and the diode region to control the spatial hole burning such that wideband frequency characteristics are obtained, wherein a Bragg wavelength in the reflection region is shorter than that in the diode region.

2. The laser diode as set forth in claim 1, wherein the grating layer is formed of an index-coupled grating.

3. The laser diode as set forth in claim 1, wherein a forward voltage is applied to the optical density control region.

4. A laser diode for controlling spatial hole burning, comprising:
a grating layer;
a reflection region formed at an upper portion of the grating layer;
a diode region spaced apart from the reflection region and formed at an upper portion of the grating layer; and
an optical density control region formed between the reflection region and the diode region to control the spatial hole burning such that wideband frequency characteristics are obtained,
wherein the optical density region adjusts a distance between a −1 mode and a mode generated by $\lambda/4$ phase shift to control an oscillation frequency.

5. The laser diode as set forth in claim 1, wherein the optical density control region is formed at an InGaAsP active layer grown on the grating layer.

6. The laser diode as set forth in claim 4, wherein the oscillation frequency has a band raging from 100 GHz to 300 GHz.

7. An optical pulse generating method comprising:
forming a reflection region and an optical density control region at one end of a diode region, wherein the reflection region, the optical density control region and the diode region are all formed at an upper portion of a grating layer; and
controlling an optical density of the optical density control region to alleviate spatial hole burning in the entire resonator,
wherein when the optical density of the optical density control region is controlled, a Bragg wavelength in the reflection region is made shorter than that in the diode region to increase a reflectivity with respect to a −1 mode of the diode region.

8. An optical pulse generating method comprising:
forming a reflection region and an optical density control region at one end of a diode region, wherein the reflection region, the optical density control region and the diode region are all formed at an upper portion of a grating layer; and
controlling an optical density of the optical density control region to alleviate spatial hole burning in the entire resonator,
wherein a distance between a −1 mode of the diode region and a mode generated by $\lambda/4$ phase shift is adjusted by controlling the optical density of the optical density control region to obtain a desired oscillation frequency.

9. The optical pulse generating method as set forth in claim 7, wherein the grating layer is formed of an index-coupled grating.

10. The optical pulse generating method as set forth in claim 7, wherein a forward voltage above a built-in voltage is applied to the optical density control region.

11. The optical pulse generating method as set forth in claim 7, wherein the optical density control region is formed at an InGaAsP active layer grown on the grating layer.

12. The optical pulse generating method as set forth in claim 7, wherein the oscillation frequency has a band raging from 100 GHz to 300 GHz.

13. A laser diode for controlling spatial hole burning, comprising:
a grating layer;
a diode region formed at an upper portion of the grating layer; and
an optical density control region having one side where a high-reflectivity coating film for wavelength reflection and formed adjacent to the diode region at an upper portion of the grating layer to suppress the spatial hole burning such that single-mode oscillation is obtained.

14. The laser diode as set forth in claim 13, wherein the grating layer is formed of an index-coupled grating.

15. The laser diode as set forth in claim 13, wherein the diode region is a region in which a $\lambda/4$ phase-shifted distributed feedback (DFB) laser diode is formed.

16. The laser diode as set forth in claim 13, wherein the optical density control region is formed at an InGaAsP active layer grown on the grating layer.

* * * * *